United States Patent [19]

Kaji et al.

[11] Patent Number: 5,153,236
[45] Date of Patent: Oct. 6, 1992

[54] PHOTOPOLYMERIZABLE COMPOSITION

[75] Inventors: Makoto Kaji; Futami Kaneko; Nobuyuki Hayashi, all of Hitachi, Japan

[73] Assignee: Hitachi Chemical Co., Ltd., Tokyo, Japan

[21] Appl. No.: 715,010

[22] Filed: Jun. 13, 1991

Related U.S. Application Data

[63] Continuation of Ser. No. 7,282,981, Nov. 29, 1988, which is a continuation of Ser. No. 7,026,371, Mar. 16, 1987, abandoned.

[30] Foreign Application Priority Data

Apr. 23, 1986 [JP] Japan .................. 61-94140

[51] Int. Cl.$^5$ .................. C08F 2/50
[52] U.S. Cl. .................. 522/14; 522/26; 522/28; 522/121
[58] Field of Search .................. 522/14, 26, 28, 121

[56] References Cited

U.S. PATENT DOCUMENTS

| | | | |
|---|---|---|---|
| 4,247,623 | 1/1981 | Guild | 522/14 |
| 4,289,844 | 9/1981 | Specht | 522/8 |
| 4,405,705 | 9/1983 | Etoh | 430/270 |
| 4,447,520 | 5/1984 | Henne | 522/64 |

FOREIGN PATENT DOCUMENTS

| | | | |
|---|---|---|---|
| 2433072 | 1/1976 | Fed. Rep. of Germany . | |
| 11936 | 3/1974 | Japan . | |
| 4604 | 1/1981 | Japan . | |
| 139508 | 10/1981 | Japan . | |
| 221403 | 11/1985 | Japan . | |
| 6125138 | 2/1986 | Japan | 522/14 |
| 144641 | 7/1986 | Japan | 522/121 |
| 123450 | 6/1987 | Japan . | |

OTHER PUBLICATIONS

C. G. Roffey, Photopolymerization of Surface Coatings, 1982, 70, 71, 88, 89.

Primary Examiner—Ana L. Carrillo
Assistant Examiner—David Buttner
Attorney, Agent, or Firm—Antonelli, Terry Stout & Kraus

[57] ABSTRACT

A photopolymerizable composition comprising an addition polymerizable compound, an N-aryl-α-amino acid and a photosensitizer capable of absorbing a light having a wavelength of 300 nm or more such as thioxanthones, isoalloxazines, coumarines, and the like is excellent in sensitivity to irradiated light and is suitable for preparing relief images, photoresists, etc.

9 Claims, 1 Drawing Sheet

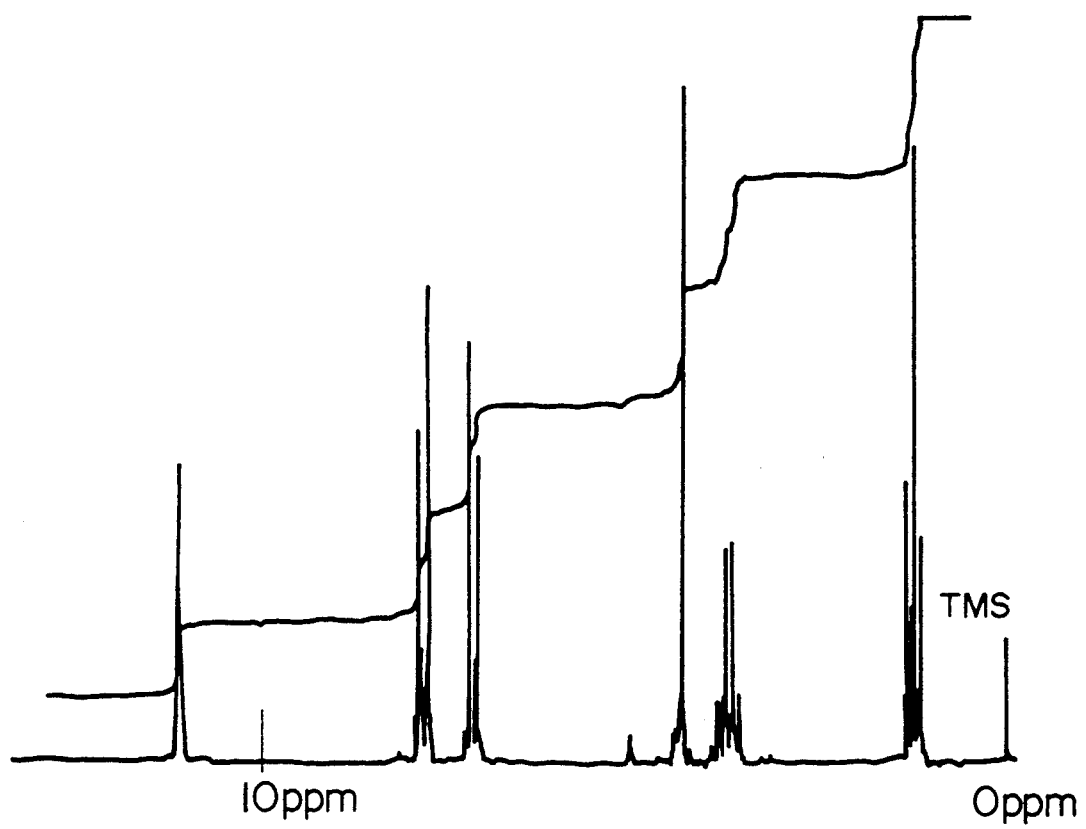

PHOTOPOLYMERIZABLE COMPOSITION

This application is a continuation of application Ser. No. 07/282,981, filed Nov. 29, 1988, which is a continuation application of Ser. No. 07/026,371, filed Mar. 16, 1987, now abandoned.

BACKGROUND OF THE INVENTION

This invention relates to a photopolymerizable composition, more particularly to a photopolymerizable composition containing a special photo initiator.

Photopolymerizable compositions are widely used for preparing letterpresses, relief images, photoresists, and the like by using a UV light source in general, and are desired to have higher sensitivity. Particularly when scanning exposure to light by using a laser beam is aimed at, it is necessary to have high sensitivity to visible light, for example, major output wavelengths of 458, 488, and 514 nm in the case of an argon ion laser. Heretofore, there have been made various studies on photo initiators in this field for increasing the sensitivity. As to the photo initiators, there have been known a number of substances such as benzoin and derivatives thereof, substituted or non-substituted polynuclear quinones, etc., but there have not been known those having sufficient sensitivity particularly to the visible light.

On the other hand, there are known compositions comprising an N-aryl-α-amino acid such as N-phenylglycine and various photo-absorbing compounds (e.g. Japanese Patent Unexamined Publication No. 57-83501). But these compositions are insufficient in sensitivity and have various disadvantages in that there is a problem of a bad odor, adhesiveness to a copper-clad laminate is insufficient, storage stability is poor, and the like.

SUMMARY OF THE INVENTION

This invention provides a photopolymerizable composition having high sensitivity to ultraviolet light and visible light as well as excellent properties.

This invention provides a photopolymerizable composition comprising (a) an addition polymerizable compound having a boiling point of 100° C. or higher at an atmospheric pressure, (b) an N-aryl-α-amino acid represented by the formula:

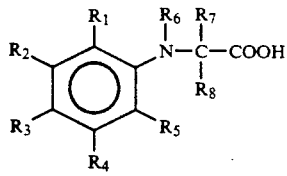

[I]

wherein $R_1$, $R_2$, $R_3$, $R_4$ and $R_5$ are independently a hydrogen atom, an alkyl group having 1 to 12 carbon atoms, or a halogen atom; $R_6$ is an alkyl group having 1 to 12 carbon atoms, a cycloalkyl group, a hydroxyalkyl group having 1 to 12 carbon atoms, an alkoxyalkyl group having 1 to 12 carbon atoms, an aminoalkyl group having 1 to 12 carbon atoms, or an aryl group; and $R_7$ and $R_8$ are independently a hydrogen atom, or an alkyl group having 1 to 8 carbon atoms, and (c) a photosensitizer capable of absorbing a light having a wavelength of 300 nm or more.

BRIEF DESCRIPTION OF THE DRAWING

The attached drawing is a H'-NMR spectrum of N-ethyl-N-(p-chlorophenyl)glycine used in an Example of this invention.

DESCRIPTION OF THE PREFERRED EMBODIMENTS

The addition polymerizable compound used as the component (a) should have a boiling point of 100° C. or higher at an atomspheric pressure. If the boiling point is lower than 100° C. at an atmospheric pressure, the addition polymerizable compound will evaporate at the time of removing a solvent contained in the system by drying or the like or irradiating an actinic light; this is undesirable from the viewpoint of properties and workability. In order to prepare a uniform composition together with a photo initiator, etc., the use of addition polymerizable compounds soluble in an organic solvent used is preferable.

As the organic solvent, there can be used acetone, methyl ethyl ketone, toluene, chloroform, methanol, ethanol, 1,1,1-trichloroethane, etc.

As the addition polymerizable compounds having a boiling point of 100° C. or higher at an atmospheric pressure, there can be used condensation products of polyhydric alcohols and α,β-unsaturated carboxylic acids such as diethylene glycol di(meth)acrylate ["di(-meth)acrylate" means diacrylate or dimethacrylate, hereinafter used in the same manner], triethylene glycol di(meth)acrylate, tetraethylene glycol di(meth)acrylate, trimethylolpropane di(meth)acrylate, trimethylolpropane tri(meth)acrylate, 1,3-propanediol di(meth)acrylate, 1,3-butanediol (meth)acrylate, pentaerythritol tetra(meth)acrylate, dipentaerythritol hexa(meth)acrylate, dipentaerythritol penta(meth)acrylate, 2,2-bis(4-acryloxydiethoxyphenyl)propane, 2,2-bis(4-methacryloxypentaethoxyphenyl)propane, 2,2-bis(4-methacryloxypolyethoxyphenyl)propane mixture [BPE-500, a trade name, mfd. by Shin-Nakamura Chemical Co., Ltd.], etc.; reaction products of glycidyl group-containing compounds and α,β-unsaturated carboxylic acids such as trimethylolpropane triglycidyl ether tri(meth)acrylate, bisphenol A diglycidyl ether di(meth)acrylate, etc.; unsaturated amides such as methylenebisacrylamide, ethylenebisacrylamide, 1,6-hexamethylenebisacrylamide, etc.; vinyl esters such as divinyl succinate, divinyl adipate, divinyl phthalate, divinyl terephthalate, divinylbenzene-1,3-disulfonate, etc.

These addition polymerizable compounds can be used alone or as a mixture thereof.

The N-aryl-α-amino acid used as the component (b) is represented by the formula:

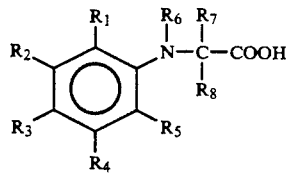

[I]

wherein $R_1$, $R_2$, $R_3$, $R_4$ and $R_5$ are independently a hydrogen atom, an alkyl group having 1 to 12 carbon atoms, or a halogen atom; $R_6$ is an alkyl group having 1 to 12 carbon atoms, a cycloalkyl group, a hydroxyalkyl group having 1 to 12 carbon atoms, an alkoxyalkyl group having 1 to 12 carbon atoms, an aminoalkyl group having 1 to 12 carbon atoms, or an aryl group such as a phenyl group, a p-bromophenyl group, a p-chlorophenyl group, a p-methoxyphenyl group, and a m-cyanophenyl group; and $R_7$ and $R_8$ are independently a hydrogen atom, or an alkyl group having 1 to 8 carbon atoms. Needless to say, $R_1$ through $R_8$ can be the same.

N-substituted-N-aryl-α-amino acids can be derived, for example, from an N-aryl-α-amino acid.

For example, an N-alkyl-N-aryl-α-amino acid alkyl ester can be obtained by reacting an N-aryl-α-amino acid with an alkyl halide in the presence of an alkali in a solvent at 30° to 150° C. for 2 to 6 hours. Then, the alkyl ester is hydrolyzed by the action of an alcoholic alkali to yield an N-alkyl-N-aryl-α-amino acid.

Preferable examples of the N-aryl-α-amino acids of the formula [I] are N-methyl-N-phenylglycine, N-ethyl-N-phenylglycine, N-(n-propyl)-N-phenylglycine, N-(n-butyl)-N-phenylglycine, N-(2-methoxyethyl)-N-phenylglycine, N-methyl-N-phenylalanine, N-ethyl-N-phenylalanine, N-(n-propyl)-N-phenylalanine, N-(n-butyl)-N-phenylalanine, N-methyl-N-phenylvaline, N-methyl-N-phenylleucine, N-methyl-N-(p-tolyl)glycine, N-ethyl-N-(p-tolyl)glycine, N-(n-propyl)-N-(p-tolyl)glycine, N-(n-butyl)-N-(p-tolyl)glycine, N-methyl-N-(p-chlorophenyl)glycine, N-ethyl-N-(p-chlorophenyl)glycine, N-(n-propyl)-N-(p-chlorophenyl)glycine, N-methyl-N-(p-bromophenyl)glycine, N-ethyl-N-(p-bromophenyl)glycine, N-(n-butyl)-N-(p-bromophenyl)glycine, N,N-diphenylglycine, N-methyl-N-(p-iodophenyl)glycine, etc. These compounds can be used alone or as a mixture thereof.

When at least one of $R_1$ through $R_5$ in the formula [I] is a halogen atom, the resulting photopolymerizable composition is improved in storage stability. Further, when $R_6$ is other than a hydrogen atom, the resulting composition has high sensitivity. Further, when at least one of $R_1$ through $R_5$ in the formula [I] is a halogen atom and $R_6$ is other than a hydrogen atom., the resulting composition has high sensitivity in addition to the improved storage stability.

As the component (c), there is used a photosensitizer capable of absorbing a light having a wavelength of 300 nm or more. When a compound which only absorbs a light of less than 300 nm is used, no effective photosensitizing activity can be obtained, since the light having a wavelength of less than 300 nm is absorbed by the addition polymerizable compound (a) predominantly.

As the photosensitizer, there can be used a compound represented by the formula

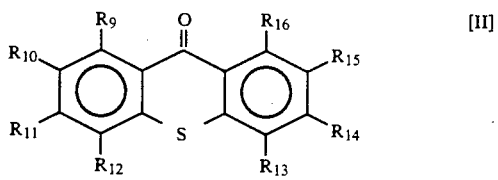

[II]

wherein $R_9$ through $R_{16}$ are independently a hydrogen atom, an alkyl group having 1 to 8 carbon atoms, or a halogen atom. Needless to say, $R_9$ through $R_{16}$ may be the same. Preferable examples of the compound of the formula [II] are 2-methylthioxanthone, 2-isopropylthioxanthone, thioxanthone, 2-ethylthioxanthone, 2-chlorothioxanthone, 2,4-dimethylthioxanthone, 2,4-diethylthioxanthone, 2,4-diisopropylthioxanthone, 2-t-butylthioxanthone, 2-t-butyl-4-methylthioxanthone, etc.

These compounds can be used alone or as a mixture thereof.

As the photosensitizer, it is also possible to use a compound having an isoalloxazine skeleton represented by the formula:

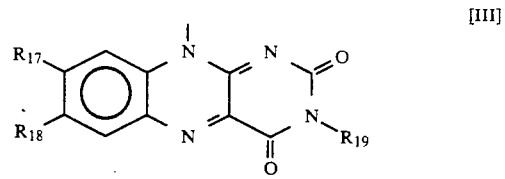

[III]

wherein $R_{17}$, $R_{18}$ and $R_{19}$ are independently a hydrogen atom, a methyl group or an ethyl group. Such a compound can have an absorption maximum at 430 to 460 nm.

Preferable examples of the compounds having an isoalloxazine skeleton of the formula [III] are riboflavin, riboflavin tetraacetate, riboflavin tetrapropionate, riboflavin tetrabutyrate, flavin mononucleotide, flavinadenine dinucleotide, lumichrome, lumiflavin, 10-phenylisoalloxazine, 7,10-dimethylisoalloxazine, 10-n-butylisoalloxazine, 10-benzylisoalloxazine, etc.

In addition, as the photosensitizer, it is possible to use a compound represented by the formula

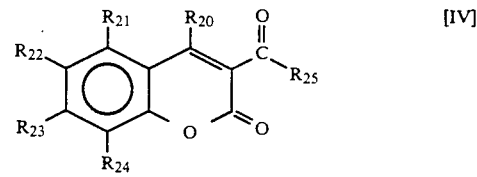

[IV]

wherein $R_{20}$ through $R_{24}$ are independently a hydrogen atom, a hydroxyl group, an amino group substituted with an alkyl group having 1 to 5 carbon atoms, an amino group substituted with two alkyl groups having 1 to 5 carbon atoms, an alkoxy group having 1 to 5 carbon atoms, an acyloxy group, an aryl group such as a phenyl group, a p-bromophenyl group, a p-chlorophenyl group, a p-methoxyphenyl group, and a m-cyanophenyl group, a halogen atom, or a thioalkyl group having 1 to 5 carbon atoms; $R_{25}$ is a phenyl group, a bisphenyl group, a naphthyl group, a thienyl group, a benzofuryl group, a furyl group, a pyridyl group, or a coumarinyl group, or the above-mentioned phenyl through coumarinyl groups substituted with an amino group, an amino group substituted with an alkyl group having 1 to 5 carbon atoms, a cyano group, an alkoxy group, a nitro group, a hydroxy group, an alkyl group, a halogen atom, a haloalkyl group, a formyl group, an alkoxycarbonyl group, an acyloxy group, or an acyl group.

Preferable examples of the compound of the formula [IV] are 3-benzoylcoumarin, 3-benzoyl-7-methoxycoumarin, 3-benzoyl-5,7-dimethoxycoumarin, 3-(4'-cyanobenzoyl)coumarin, 3-(4'-cyanobenzoyl)-7-methoxycoumarin, 3-(4'-cyanobenzoyl)-5,7-dimethoxycoumarin, 3-thienylcarbonylcoumarin, 3-thienylcarbonyl-7-methoxycoumarin, 3-(4'-methoxybenzoyl)coumarin, 3-(4'-methoxybenzoyl)-5,7-dimethoxycoumarin, 3-(4'-methoxybenzoyl)-7-methoxycoumarin, 3,3'-carbonylbiscoumarin, 3,3'-carbonylbis-7-(diethylamino)coumarin, 3,3'-carbonylbis-7-(methoxy)coumarin, 3,3'-carbonylbis-5,7-dimethoxycoumarin, etc.

As the component (c), it is possible to use one or more photo oxidisable dyes or aromatic compounds which can absorb a light having a wavelength of 300 nm or more. Examples of such compounds are 2-ethylanthraquinone, 2-t-butylanthraquinone, phenanthrenequinone, benzanthrone, 1,2-benzanthraquinone, fluorescein, 1-phenyl-1,2-propanedione, acenaphthenequinone, benzil, 4,4'-dimethoxybenzil, 4,4'-dimethylbenzil, 4,4'-dichlorobenzil, 1-methyl-2-benzoylmethylene-1,2-dihydronaphtho[1,2d]thiazole, 1-methyl-2-(α-naphthoylmethylene)benzothiazole, 2-[(1-methyl-2(1H)-benzoxazolidene)-ethylidene]-1,3-indandione, 2-[(3-methyl-2(3H)-benzothiazolylidene]-1,3-indandione, 2-[(3,3-dimethyl-1-methyl-2(3H)-indolylidene)ethylidene]-1,3-indandione, etc. These compounds can be use alone or as a mixture thereof The photopolymerizable composition of this invention may contain, if necessary, one or more high-molecular-weight organic polymers, which are thermoplastic and have a molecular weight of preferably 10,000 to 700,000. Examples of such organic polymers are as follows.

(A) Copolyesters

Copolyesters obtained from polyhydric alcohols such as ethylene glycol, triethylene glycol, tetraethylene glycol, trimethylolpropane, neopentyl glycol and polyvalent carboxylic acids such as terephthalic acid, isophthalic acid, sebacic acid, adipic acid, etc.

(B) Vinyl polymers

Homopolymers or copolymers of vinyl monomers such as methacrylic acid, acrylic acid, alkyl esters of methacrylic acid or acrylic acid, e.g., methyl (meth)acrylate, ethyl (meth)acrylate, butyl (meth)acrylate, β-hydroxyethyl (meth)acrylate, etc., styrene, vinyl toluene, vinyl chloride, vinyl butyral, etc.

(C) Polyformaldehyde
(D) Polymethane
(E) Polycarbonate
(F) Nylons or polyamides
(G) Cellulose esters For example, methyl cellulose, ethyl cellulose, etc.

By the addition of the high-molecular-weight organic polymer to the photopolymerizable composition, properties such as adhesiveness to substrates, chemical resistance, film-forming properties, and the like can be improved. The high-molecular-weight organic polymer can preferably be used in an amount of 80% by weight or less based on the total weight of the high-molecular-weight organic polymer and the addition polymerizable compound. If the amount is more than 80% by weight, the photo curing cannot proceed sufficiently; this is not preferable.

It is preferable to use the component (b), the N-aryl-α-amino acid of the formula [I], in an amount of 0.1 to 10.0 parts by weight and the component (c), the photosensitizer, in an amount of 0.02 to 5 parts by weight, based on 100 parts by weight of the component (a), the addition polymerizable compound, or 100 parts by weight of a total of the component (a) and the high-molecular-weight organic polymer.

The photopolymerizable composition may further contain one or more conventional coloring substances such as dyes, and pigments depending on purposes. Examples of such coloring substances are fuchsin, Crystal Violet, Methyl Orange, Nile Blue 2B, Victoria Pure Blue, Malachite Green, Night Green B, Spilon Blue, etc.

The polymerizable composition may further contain one or more radical polymerization inhibitors or retarders in order to enhance the stability during storage.

Examples of such radical polymerization inhibitors or retarders are p-methoxyphenol, hydroquinone, pyrogallol, naphthylamine, phenothiazine, pyridine, nitrobenzene, aryl phosphite, etc.

If necessary, the photopolymerizable composition may contain other conventional additives such as plasticizers, adhesion accelerators, etc.

The photopolymerizable composition can be used for producing printing plates by coating it on a support, laminating the resulting support on a substrate, followed by exposure to actinic light, or as photo resists used for forming circuits by etching or plating.

As the actinic light source, there can be used those emitting actinic light having a wavelength of mainly 300 to 550 nm. Examples of such light sources are a carbon arc lamp, a mercury lamp, a xenon arc lamp, an argon glow lamp, an argon ion laser, etc.

As the support, there can be used organic polymer films such as a polyethylene film, a polypropylene film, a polyethylene terephthalate film, etc., metal plates such as a copper plate, an aluminum plate, an iron plate, etc., copper-clad insulating plates, e.g., glass-epoxy substrates, paper-epoxy substrates, paper-phenol substrates, etc.

According to the photopolymerizable composition of this invention, it seems that the component (c) absorbs light to produce an oxidating active state, and conducts an oxidation-reduction reaction with the component (b) to generate active radicals which are effective for the polymerization, which results in producing high sensitivity.

This invention is illustrated by way of the following Examples, in which all percents and parts are by weight unless otherwise specified.

EXAMPLES 1 TO 13, COMPARATIVE EXAMPLES 1 TO 16

Preparation of Photopolymerizable Compositions

Using the following ingredients, photopolymerizable compositions were prepared.

| | |
|---|---|
| 40% Ethyl Cellosolve solution of acrylic polymer*[1] | 120 parts |
| Tetraethylene glycol diacrylate | 25 parts |
| Hydroquinone | 0.04 part |
| Photo initiator*[2] (shown in Table 2) | |
| Victorian Pure Blue | 0.8 part |
| Methyl ethyl ketone | 20 parts |

*[1]Acrylic polymer is a copolymer of methacrylic acid/methyl methacrylate/butyl methacrylate/2-ethylhexyl acrylate = 23/51/6/20 in weight ratio, weight average molecular weight = about 90,000
*[2]The term "photoinitiator" means both the components (b) and (c) in the composition of this invention.

N-Methyl-N-phenylglycine (hereinafter referred to as "NMPG") shown in Table 2 was synthesized as follows. The other compounds were also synthesized in the same manner as NMPG.

(i) Synthesis of N-methyl-N-phenylglycine methyl ester

In a four-necked flask, 50 g of N-phenylglycine and 100 g (2.2 equivalent weight) of potassium carbonate were placed, and 700 ml of dried tetrahydrofuran was added thereto. While refluxing, 103 g (2.2 equivalent weight) of methyl iodide was added dropwise in one hour, followed by one hour's reflux. The tetrahydrofuran was evaporated from the reaction mixture under reduced pressure. Then, water was added thereto and extraction with ether was carried out. The ether layer was dried, and solvent was evaporated off to yield N-methyl-N-phenylglycine methyl ester in 37 g, followed by evaporation under reduced pressure for purification (b.p. 79°–81° C./1 mm Hg).

(ii) Synthesis of N-methyl-N-phenylglycine

To 500 ml of water/methanol (¼ weight ratio), 30 g of N-phenyl-N-methylglycine methyl ester and 12.3 g (1.1 equivalent weight) of NaOH were added and refluxed for 2 hours. The methanol was evaporated from the reaction mixture under reduced pressure. Then, water was added thereto and unreacted starting materials were extracted with methylene chloride. Subsequently, 10% hydrochloric acid was added to the aqueous layer to adjust the pH at about 5, followed by extraction with ether. The ether layer wad dried, and solvent distilled to yield N-methyl-N-phenylglycine in 27.1 g.

(iii) Synthesis of N-ethyl-N-formyl-p-chloroaniline and N-ethyl-p-chloroaniline

According to the method described at page 420 of Organic Synthesis, collective volume II (John-Wiley & Sons, 1943), N-ethyl-N-formyl-p-chloroaniline was obtained from p-chloroaniline. Further, N-ethyl-p-chloroaniline was synthesized from the N-ethyl-N-formyl-p-chloroaniline.

(iv) Synthesis of N-ethyl-N-(p-chlorophenyl)glycine

In a 300-ml three-necked flask equipped with a dropping funnel, a reflux condenser and a mechanical stirrer, 20 g of N-ethyl-p-chloroaniline obtained in (iii), 17 g (1.3 equivalent weight) of sodium carbonate and 60 ml of water were placed and refluxed with heating. Then, 15.8 g (1.3 equivalent weight) of monochloroacetic acid was dissolved in 50 ml of water and dropped into the flask for about 30 minutes, followed by 3 hour's reflux with heating. After cooling naturally, the contents were transferred to a separatory funnel, to which 100 ml of ethyl acetate was added, followed by sufficient shaking. The aqueous layer was separated and 70 ml of a 5% aqueous solution of sodium hydroxide was added to the oil layer, followed by shaking. The resulting aqueous layer was combined with the aqueous layer previously separated. To the combined aqueous layer, 1N-HCl was added gradually to produced white turbidity until almost neutrality was obtained. After allowed to stand, crystals were deposited. The crystals were filtered, washed with water and dried to yield 20.8 g (76%) of N-ethyl-N-(p-chlorophenyl)glycine.

H'-NMR data (in ppm) of N-phenyl-N-methylglycine methyl ester and N-phenyl-N-methylglycine were shown in Table 1.

TABLE 1

|  | N-phenyl-N-methyl-glycine methyl ester | N-phenyl-N-methyl-glycine (NMPG) |
|---|---|---|
| Proton on aromatic ring | 6.53–7.37(m):5H | 6.4–7.4(m.):5H |
| NH | — | — |
| CO$_2$H | — | 9.26(s.):1H |
| N—Me | 3.00(s.):3H | 2.93(s.):3H |
| Ar—NCH$_2$ | 4.01(s.):2H | 3.94(s.):2H |
| OMe | 3.65(s.):3H | — |

The attached drawing shows H'-NMR spectrum of N-ethyl-N-(p-chlorophenyl)glycine (solvent CDCl$_3$; tetramethylsilane as internal standards).

Each photopolymerizable composition mentioned above was dissolved with stirring and coated on a polyethylene terephthalate film (Lumilar, a trade name, mfd. by Toray Industries, Inc.) with 23 μm thick by using a bar coater and dried in a hot-air convection type dryer at 100° C. for about 3 minutes to give a photopolymerizable element. The thickness of the dried photopolymerizable composition layer was 30 μm.

Then, using a laminator for laminating with pressing and heating using rubber rolls, the photopolymerizable element was laminated on a copper-clad glass-epoxy laminate with 1.6 mm thick having a clear surface so as to contact the photopolymerizable composition layer with the copper surface (rubber roll temperature: 160° C.).

To the laminated sample of polyethylene terephthalate film, a step tablet (Gray Scale, a trademark, mfd. by Dainippon Screen Mfg. Co., Ltd.: optical density difference 0.15, minimum optical density 0.05, maximum optical density 3.05, negative film with 21 level differences) were adhered and exposed to a light from a 3 KW ultrahigh-pressure mercury lamp (Phoenix 3000, a trademark, mfd. by ORC Seisakusho, Ltd.) for 15 seconds. Using "Ultraviolet Illuminometer UV-Mol" (mfd. by ORC Seisakusho, Ltd.) and a sensor having the spectral sensitivity maximum at 420 nm, the exposure intensity at the irradiated surface was measured to be 21.2 mW/cm$^2$. The exposure amount measured by using a sensor having the spectral sensitivity maximum at 350 nm was 6.4 mW/cm$^2$.

Then, the polyethylene terephthalate film was removed and the resulting laminate was immersed in a 2% aqueous solution of Na$_2$CO$_3$ at 30° C. for 40 seconds with moving to release uncured portions to measure the sensitivity of a photopolymerizable composition in terms of the level difference of the step tablet (the larger the number of level, the higher the sensitivity). Table 2 shows sensitivities of individual Examples and Comparative Examples.

In comparative Examples 5 to 9, the generation of odor and lowerness of the adhesiveness to the copper-clad laminates were admitted. In contrast, in all the Examples of this invention, no odor was generated and the adhesiveness to the copper-clad laminates were good.

TABLE 2

| Example No. | Photoinitiator | Amount (parts) | Sensitivity (level no.) |
|---|---|---|---|
| Comparative Example 1 | 2,4-Diethylthioxanthone | 1.2 | 5.6 |
| Comparative Example 2 | Benzophenone | 4.0 | 2.8 |
| Comparative Example 3 | N-Phenylglycine | 2.0 | 0 |
| Comparative Example 4 | N-Phenyl-N-methylglycine | 2.0 | 0 |
| Comparative Example 5 | 2,4-Diethylthioxanthone | 1.2 | 14.7 |
|  | N-Phenylglycine | 2.0 |  |
| Comparative Example 6 | 7-Methoxy-3-benzoylcoumarin | 0.2 | 13.6 |
|  | N-Phenylglycine | 2.0 |  |
| Comparative Example 7 | 5,7-Dimethoxy-3-(4'-cyanobenzoyl)coumarin | 0.1 | 12.8 |
|  | N-Phenylglycine | 2.0 |  |
| Comparative Example 8 | 3,3'-Carbonylbis-7-diethylaminocoumarin | 0.2 | 13.7 |
|  | N-Phenylglycine | 2.0 |  |
| Comparative Example 9 | Riboflavin tetrabutyrate | 1.0 | 11.0 |
|  | N-Phenylglycine | 2.0 |  |
| Comparative Example 10 | Riboflavin tetrabutyrate | 1.0 | 12.0 |

TABLE 2-continued

| Example No. | Photoinitiator | Amount (parts) | Sensitivity (level no.) |
|---|---|---|---|
| | Methyl N,N-dimethyl-anthranilate | 2.0 | |
| Comparative Example 11 | Riboflavin tetrabutyrate | 1.0 | 11.0 |
| | Isopentyl 4-dimethylaminobenzoate | 2.0 | |
| Comparative Example 12 | Michler's ketone | 0.2 | 12.0 |
| | Benzophenone | 2.0 | |
| Comparative Example 13 | Ethylanthraquinone | 3.0 | 8.0 |
| Comparative Example 14 | Riboflavin tetrabutyrate | 1.0 | 6.0 |
| Comparative Example 15 | Michler's ketone | 0.2 | 0 |
| Comparative Example 16 | 7-Methoxy-3-benzoylcoumarin | 0.4 | 0 |
| Example 1 | 2,4-Diethylthioxanthone | 1.2 | 16.6 |
| | NMPG | 2.0 | |
| Example 2 | 2,4-Diethylthioxanthone | 1.2 | 16.0 |
| | N-Ethyl-N-phenylglycine | 2.0 | |
| Example 3 | 2,4-Diethylthioxanthone | 1.2 | 16.6 |
| | N-n-Butyl-N-phenylglycine | 2.0 | |
| Example 4 | 2,4-Diethylthioxanthone | 1.2 | 15.5 |
| | N,N-Diphenylglycine | 2.0 | |
| Example 5 | 2,4-Diethylthioxanthone | 1.2 | 15.0 |
| | N-Methyl-N-(p-bromophenyl)glycine | 2.0 | |
| Example 6 | 5,7-Dimethoxy-3-(4.'-cyanobenzoyl)coumarin | 0.2 | 15.2 |
| | NMPG | 2.0 | |
| Example 7 | 3,3'-Carbonylbis-7-diethylaminocoumarin | 0.2 | 18.4 |
| | NMPG | 2.0 | |
| Example 8 | 7-Methoxy-3-benzoylcoumarin | 0.2 | 15.5 |
| | NMPG | 2.0 | |
| Example 9 | 7-Methoxy-3-benzoylcoumarin | 0.2 | 16.5 |
| | N-n-Butyl-N-phenylglycine | 2.0 | |
| Example 10 | 7-Methoxy-3-benzoylcoumarin | 0.2 | 14.5 |
| | N,N-Diphenylglycine | 2.0 | |
| Example 11 | 3,3'-Carbonylbis-7-diethylaminocoumarin | 0.2 | 19.5 |
| | N-n-Butyl-N-phenylglycine | 2.0 | |
| Example 12 | 3,3'-Carbonylbis-7-diethylaminocoumarin | 0.2 | 15.0 |
| | N,N-Diphenylglycine | 2.0 | |
| Example 13 | 3,3'-Carbonylbis-7-diethylaminocoumarin | 0.2 | 14.5 |
| | N-Methyl-N-(p-bromophenyl)glycine | 2.0 | |

EXAMPLES 14-15, COMPARATIVE EXAMPLES 17-18

Photopolymerizable elements were obtained in the same manner as described in Examples 1 to 15 except for using 2,2-bis(4-acryloxydiethoxyphenyl)propane in place of tetraethylene glycol diacrylate and photopolymerization initiators as listed in Table 3, and changing the thickness of the dried photopolymerizable composition layer to 30 μm. Each photopolymerizable element was laminated on a copper-clad glass-epoxy laminate with 1.6 mm thick in the same manner as described in Examples 1 to 15 (rubber roll temperature: 160° C.)

The resulting copper-clad glass-epoxy laminates laminated with the photopolymerizable elements were stored for days as listed in Table 3 at 23° C. and humidity of 60% and then exposed to light for development to measure sensitivity expressed in terms of the number of level. The results are shown in Table 3.

TABLE 3

| Example No. | Photoinitiator | Adding amount (parts) | Stored days | | | | | | |
|---|---|---|---|---|---|---|---|---|---|
| | | | 0.5 | 6 | 12 | 18 | 24 | 30 | 42 |
| Comparative Example 17 | 3,3'-Carbonylbis-7-diethylaminocoumarin | 0.2 | 8.0 | 8.0 | 8.0 | 8.0 | 9.0 | 9.5 | — |
| | N-Phenylglycine | 1.2 | | | | | | | |
| Comparative Example 18 | 3,3'-Carbonylbis-7-diethylaminocoumarin | 0.2 | 8.0 | 8.2 | 8.0 | 8.0 | 8.8 | 8.9 | 9.5 |
| | N-(p-Bromophenyl)-glycine | 1.2 | | | | | | | |
| Example 14 | 3,3'-Carbonylbis-7-diethylaminocoumarin | 0.2 | 9.5 | 9.5 | 9.8 | 10.5 | — | — | — |
| | N-Methyl-N-phenylglycine | 1.2 | | | | | | | |
| Example 15 | 3,3'-Carbonylbis-7-diethylaminocoumarin | 0.2 | 10.8 | 11.0 | 11.0 | 11.0 | 10.8 | 11.5 | — |
| | N-Ethyl-N-(p-chlorophenyl)glycine | 1.2 | | | | | | | |

In Table 3, the mark "—" means that the development was impossible.

As mentioned above, the photopolymerizable composition of this invention has high sensitivity to ultraviolet light or visible light.

What is claimed is:
1. A photopolymerizable composition comprising:
(a) an addition polymerizable compound having a boiling point of 100° C. or higher at an atomspheric pressure,
(b) an N-aryl-α-amino acid represented by the formula:

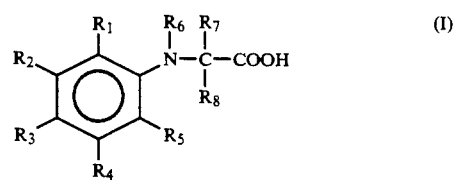

wherein $R_1$, $R_2$, $R_3$, $R_4$ and $R_5$ are independently a hydrogen atom, an alkyl group having 1 to 12 carbon atoms, or a halogen atom; $R_6$ is an alkyl group having 1 to 12 carbon atoms, a cycloalkyl group, a hydroxyalkyl group having 1 to 23 carbon atoms, an alkoxyalkyl group having 1 to 12 carbon atoms, an aminoalkyl group having 1 to 12 carbon atoms, or an aryl group; and $R_7$ and $R_8$ are independently a hydrogen atom, or an alkyl group having 1 to 8 carbon atoms, and (c) a photosensitizer capable of absorbing a light having a wavelength of 300 nm or more; said photosensitizer comprising at least one compound represented by the formula:

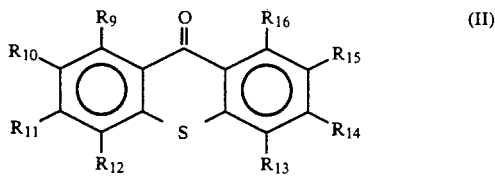

(II)

wherein $R_9$ and $R_{16}$ are independently a hydrogen atom, an alkyl group having 1 to 8 carbon atoms or a halogen atom, or at least one compound having an isoalloxazine skeleton selected from the group consisting of riboflavin, riboflavin tetraacetate, riboflavin tetrapropionate, riboflavin tetrabutyrate, flavin mononucleotide, flavinadenine, dinucleotide, lumichrome, lumiflavin, 10-phenyl-isoalloxazine, 7,10-dimethylisoalloxazine, 10-n-butylisoalloxazine and 10-benzylisoalloxazine or at least one compound represented by the formula:

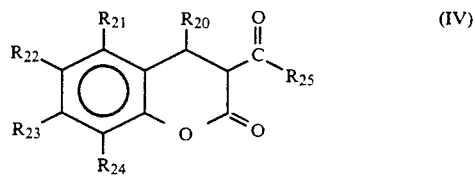

(IV)

wherein $R_{20}$ through $R_{24}$ are independently a hydrogen atom, a hydroxyl group and an amino group substituted with an alkyl group having 1 to 5 carbon atoms, an amino group substituted with two alkyl groups having 1 to 5 carbon atoms, an alkoxy group having 1 to 5 carbon atoms, an acyloxy group, an aryl group, a halogen atom, or a thioalkyl group having 1 to 5 carbon atoms; $R_{25}$ is a phenyl group, a bisphenyl group, a naphthyl group, a thienyl group, a benzofuryl group, a furyl group, a pyrridyl group or a coumarinyl group, or the above-mentioned phenyl through coumarinyl group substituted with an amino group, an amino group substituted with an alkyl group having 1 to 5 carbon atoms, a cyano group, an alkoxy group, a nitro group, a hydroxyl group, an alkyl group, a halogen atom, a haloalkyl group, a formyl group, an alkoxycarbonyl group, an acyloxy group or an acyl group, or at least one compound selected from the group consisting of 2-ethylanthraquinone, 2-t-butylanthraquinone, phenanthrenequinone, benzanthrone, 1,2-benzanthraquinone, fluorescein, 1-phenyl-1,2-propanedione, acenaphthenequinone, benzil, 4,4'-dimethoxybenzil, 4,4'-dichlorobenzil, 1-methyl-2-benzoylmethylene-1,2-dihydronaphtho(1,2d)-thiazole, 1-methyl-2-(α-naphthoylmethylene-benzothiazole, 2-(1-methyl-2(1H)-benzoxazolidane)-ethylidene)-1,3-indandione, and 2-(3-methyl-2(3H)-benzothiozaolylidene)-ethylidene)-1,3-indandione.

2. A composition according to claim 1, which further comprises a high-molecular-weight organic polymer in an amount of 80% by weight or less based on the total weight of the high-molecular-weight organic polymer and the addition polymerizable compound.

3. A composition according to claim 2, wherein the component (b) is contained in an amount of 0.1 to 10.0 parts by weight and the component (c) is contained in an amount of 0.02 to 5 parts by weight based on 100 parts by weight of a total of the component (a) and the high-molecular-weight organic polymer.

4. A composition according to claim 1, wherein the component (c) is at least one compound selected from the group consisting of 2-methylthioxanthone, 2-isopropylthioxanthone, thioxanthone, 2-ethylthioxanthone, 2-chlorothioxanthone, 2,4-dimethylthioxanthone, 2,4-diethylthioxanthone, 2,4-diisopropyltioxanthone, 2-t-butylthioxanthone and 2-t-butyl-4-methylthioxanthone.

5. A composition according to claim 1, wherein the component (c) is at least one compound selected from the group consisting of 3-benzoylcoumarin, 3-benzoyl-7-methoxycoumarin, 3-benzoyl-5,7-dimethoxycoumarin, 3-(4'-cyanobenzoyl)-coumarin, 3-(4'-cyanobenzoyl)-5,7-dimethoxycoumarin, 3-thienylcarbonyl-coumarin, 3-thienylcarbonyl-7-methoxycoumarin, 3-(4'-methoxybenzoyl)coumarin, 3-(4'-methoxybenzoyl)-5,7-methoxycoumarin, 3,3'-carbonylbiscoumarin, 3,3'-carbonylbis-7-(diethylamino)coumarin and 3,3'-carbonylbis-5,7-dimethoxycoumarin.

6. A composition according to claim 1, wherein the component (c) is at least one compound selected from the group consisting of 2-ethylanthraquinone, 2-t-butylanthraquinone, phenanthrenequinone, benzanthrone, 1,2-benzanthraquinone, fluorescein, 1-phenyl-1,2-propanedione, acenaphthenequinone, benzil, 4,4'-dimethoxybenzil, 4,4'-dichlorobenzil, 1-methyl-2-benzoylmethylene-1,2-dihydronaphtho-thiazole, 1-methyl-2-(α-naphthoylmethylene-benzothiazole, 2--1,3-indandione, and 2-1,3-indandione.

7. A composition according to claim 1, wherein the component (b) is contained in an amount of 0.1 to 10.0 parts by weight and the compound (c) is contained in an amount of 0.02 to 5 parts by weight based on 100 parts by weight of the component (a).

8. A composition according to claim 7, wherein the N-aryl-α-amino acid (b) is selected from the group consisting of N-methyl-N-phenylglycine, N-ethyl-N-phenyglycine, N-(n-propyl)-N-phenylglycine, N-(n-butyl)-N-phenylglycine, N-(2-methoxyethyl)-N-phenylglycine, N-methyl-N-phenylalanine, N-ethyl-N-phenylalanine, N-(n-propyl)-N-phenylalanine, N-(n-butyl)-N-phenylalanine, N-methyl-N-phenylvaline, N-methyl-N-phenylleucine, N-methyl-N-(p-tolyl)glycine, N-ethyl-N-(p-tolyl)glycine, N-(n-propyl)-N-(p-tolyl)glycine. N-(n-butyl)-N-(p-tolyl)glycine, N-methyl-N-(p-chlorophenyl)glycine, N-ethyl-N-(p-chlorophenyl)glycine, N-(n-propyl)-N-(p-chlorophenyl)glycine, N-methyl-N-(p-bromophenyl)glycine, N-ethyl-N-(p-bromophenyl)glycine, N(n-butyl)-N-(p-bromophenyl)glycine, and N,N-diphenylglycine, N-methyl-N-(p-iodophenyl)glycine a mixture thereof.

9. A photopolymerizable composition comprising:
(a) an addition polymerizable compound having a boiling point of 100° C. or higher at an atmospheric pressure,
(b) an N-aryl-α-amino acid represented by the formula:

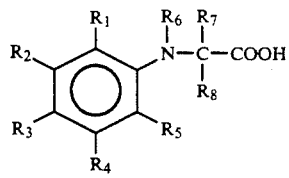 [I]

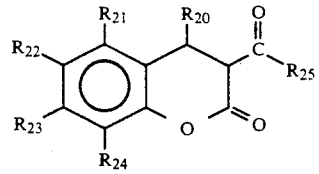 [IV]

wherein $R_1$, $R^2$, $R^3$, $R^4$ and $R^5$ are independently a hydrogen atom, an alkyl group having 1 to 12 carbon atoms, or a halogen atom; $R_6$ is an alkyl group having 1 to 12 carbon atoms, a cycloalkyl group, a hydroxyalkyl group having 1 to 23 carbon atoms, an alkoxyalkyl group having 1 to 12 carbon atoms, an aminoalkyl group having 1 to 12 carbon atoms, or an aryl group; and $R_7$ $R_8$ are independently a hydrogen atom or an alkyl group having 1 to 8 carbon atoms, and (c) a photosensitizer capable of absorbing a light having a wavelength of 300 nm or more; said photosensitizer comprising at least one compound having an isoalloxazine skeleton selected from the group consisting of riboflavin, riboflavin tetraacetate, riboflavin tetrapropionate, riboflavin tetrabutyrate, flavin mononucleotide, flavinadenine dinucleotide, lumichrome, lumiflavin, 10-phenyl-isoalloxazine, 7,10-dimethylisoalloxazine, 10-n-butylisoalloxazine and 10-benzylisoalloxazine or at least one compound represented by the formula:

wherein $R_{20}$ through $R_{24}$ are independently a hydrogen atom, a hydroxyl group and an amino group substituted with an alkyl group having 1 to 5 carbon atoms, an amino group substituted with two alkyl groups having 1 to 5 carbon atoms, an alkoxy group having 1 to 5 carbon atoms, an acyloxy group, an aryl group, a halogen atom, or a thioalkyl group having 1 to 5 carbon atoms; $R_{25}$ is a phenyl group, a bisphenyl group, a naphthyl group, a thienyl group, a benzofuryl group, a furyl group, a pyrridyl group or a coumarinyl group, or the abovementioned phenyl through coumarinyl group substituted with an amino group, an amino group substituted with an alkyl group having 1 to 5 carbon atoms, a cyano group, an alkoxy group, a nitro group, a hydroxyl group, an alkyl group, a halogen atom, a haloalkyl group, a formyl group, an alkoxycarbonyl group, an acyloxy group or an acyl group, or at least one compound selected from the group consisting of 2-ethylanthraquinone, 2-t-butylanthraquinone, phenanthrenequinone, benzanthrone, 1,2-benzanthraquinone, fluorescein, 1-phenyl-1,2-propanedione, acenaphthenequinone, benzil, 4,4'-dimethoxybenzil, 4,4'-dichlorobenzil, 1-methyl-2-benzoylmethylene-1,2-dihydronaphtho-thiazole, 1-methyl-2-(α-naphthoylmethylene-benzothiazole, 2-1,3-indandione, and 2-1,3-indandione.

* * * * *